(12) United States Patent
Gan et al.

(10) Patent No.: US 9,666,471 B2
(45) Date of Patent: May 30, 2017

(54) SEMICONDUCTOR STRUCTURE HAVING GAP WITHIN GATE AND CAP AND PROCESS THEREOF

(71) Applicant: UNITED MICROELECTRONICS CORP., Hsin-Chu (TW)

(72) Inventors: Tian Choy Gan, Tainan (TW); Chu-Yun Hsiao, Tainan (TW); Chun-Che Huang, Tainan (TW); Chia-Fu Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/711,777

(22) Filed: May 14, 2015

(65) Prior Publication Data

US 2016/0300755 A1 Oct. 13, 2016

(30) Foreign Application Priority Data

Apr. 13, 2015 (TW) .............................. 104111803 A

(51) Int. Cl.
| | |
|---|---|
| *H01L 21/3205* | (2006.01) |
| *H01L 21/4763* | (2006.01) |
| *H01L 21/762* | (2006.01) |
| *H01L 21/768* | (2006.01) |
| *H01L 29/423* | (2006.01) |
| *H01L 29/40* | (2006.01) |

(52) U.S. Cl.
CPC .... *H01L 21/76224* (2013.01); *H01L 21/7684* (2013.01); *H01L 21/76897* (2013.01); *H01L 29/401* (2013.01); *H01L 29/4236* (2013.01)

(58) Field of Classification Search
CPC ........... H01L 21/76224; H01L 29/4236; H01L 29/401
USPC .......... 257/401, E21.444, E21.409; 438/587, 438/589, 591, 592
See application file for complete search history.

(56) References Cited

U.S. PATENT DOCUMENTS

| | | | | |
|---|---|---|---|---|
| 5,796,150 | A | * | 8/1998 | Wuu .................... H01L 27/1108 257/351 |
| 9,064,932 | B1 | * | 6/2015 | Pham .............. H01L 21/823437 |
| 2013/0270644 | A1 | | 10/2013 | Anderson |
| 2014/0151763 | A1 | | 6/2014 | Hung |
| 2015/0076624 | A1 | * | 3/2015 | Liu .................... H01L 21/32115 257/412 |
| 2016/0056181 | A1 | * | 2/2016 | Anderson ........... H01L 27/1211 257/347 |

* cited by examiner

*Primary Examiner* — Robert Huber
(74) *Attorney, Agent, or Firm* — Winston Hsu; Scott Margo

(57) ABSTRACT

A semiconductor process includes the following step. A metal gate strip and a cap layer are sequentially formed in a trench of a dielectric layer. The cap layer and the metal gate strip are cut off to form a plurality of caps on a plurality of metal gates, and a gap isolates adjacent caps and adjacent metal gates. An isolation material fills in the gap. The present invention also provides semiconductor structures formed by said semiconductor process. For example, the semiconductor structure includes a plurality of stacked structures in a trench of a dielectric layer, where each of the stacked structures includes a metal gate and a cap on the metal gate, where an isolation slot isolates and contacts adjacent stacked structures at end to end, and the isolation slot has same level as the stacked structures.

24 Claims, 5 Drawing Sheets

SEMICONDUCTOR STRUCTURE HAVING GAP WITHIN GATE AND CAP AND PROCESS THEREOF

BACKGROUND OF THE INVENTION

1. Field of the Invention

The present invention relates generally to a semiconductor structure and process thereof, and more specifically to a semiconductor structure applying isolation slots in metal gate strips and process thereof.

2. Description of the Prior Art

Poly-silicon is conventionally used as a gate electrode in semiconductor devices, such as the metal-oxide-semiconductor (MOS). With the trend towards scaling down the size of semiconductor devices, however, conventional poly-silicon gates face problems such as inferior performance due to boron penetration and unavoidable depletion effect. This increases equivalent thickness of the gate dielectric layer, reduces gate capacitance, and worsens a driving force of the devices. Therefore, work function metals that are suitable for use as the high-K gate dielectric layer are used to replace the conventional poly-silicon gate to be the control electrode.

As work function metals replace conventional poly-silicon gates, relating semiconductor processes also need to be adjusted to form semiconductor components having improved performance.

SUMMARY OF THE INVENTION

The present invention provides a semiconductor structure and process thereof, which forms a metal gate strip, and then cuts off the metal gate strip to form an isolation slot in the metal gate strip to solve many processing problems and enhance sizes of semiconductor components shrinking.

The present invention provides a semiconductor process including the following steps. A metal gate strip is formed in a trench of a dielectric layer. A cap layer is formed on the metal gate strip. The cap layer and the metal gate strip are cut off to forma plurality of caps on a plurality of metal gates, and to have a gap separating adjacent caps and adjacent metal gates. An isolation material fills in the gap after the cap layer and the metal gate strip are cut off.

The present invention provides a semiconductor structure including a plurality of stacked structures located in a trench of a dielectric layer, wherein each of the stacked structures includes a metal gate and a cap on the metal gate, wherein an isolation slot isolates and contacts adjacent stacked structures at end to end, and the isolation slot has same level as the stacked structures.

The present invention provides a semiconductor structure including a plurality of stacked structures located in a trench of a dielectric layer, wherein each of the stacked structures includes a metal gate and a cap on the metal gate, wherein an isolation slot isolates and contacts adjacent stacked structures at end to end, wherein the metal gates are constituted by a same work function metal layer and a same main conductive layer, and the work function metal layer and the main conductive layer have a continuous cross-sectional profile cut off by the isolation slot.

According to the above, the present invention provides a semiconductor structure and process thereof, which sequentially forms a metal gate strip and a cap layer, and then cuts off the cap layer and the metal gate strip to form an isolation slot therein. Thereby, the present invention can have advantages rather than a conventional method of forming an isolation slot in a sacrificial gate strip before forming metal gates. For example, advantages include avoiding residues of sacrificial gate materials being left in a trench for forming the isolation slot, reducing shorter heights of metal gates occurring caused by loss of a dielectric layer, avoiding voids generating by gap filling difficulty of metal gate materials beside the isolation slot, reducing loading effect of polishing processes, reducing the etching of a height of a trench for forming the isolation slot, and solving problems of overlosing metal gates and enlarging critical dimension (CD). Therefore, the present invention can improve many problems occurring during processes, and thus enhance size miniaturization of a formed semiconductor component and improve the reliability and yields of the formed semiconductor component.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
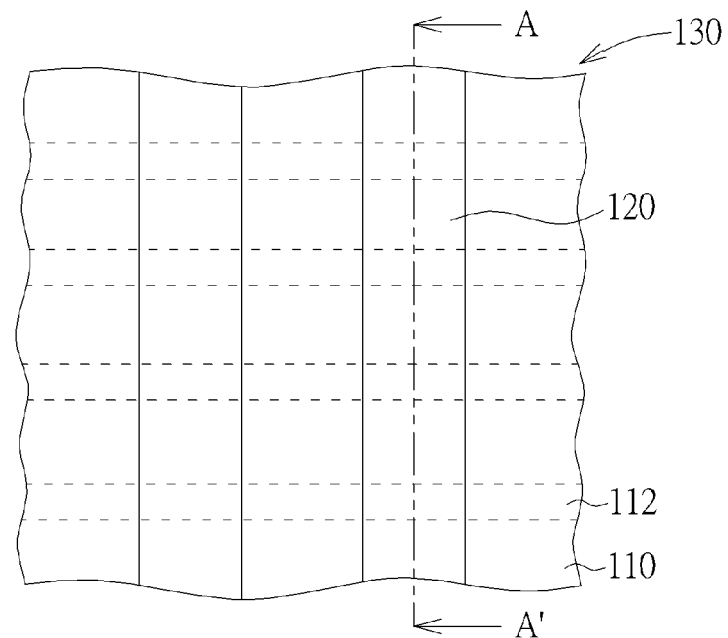
FIG. 1 schematically depicts a top view of a semiconductor process according to an embodiment of the present invention.
Figure 2:
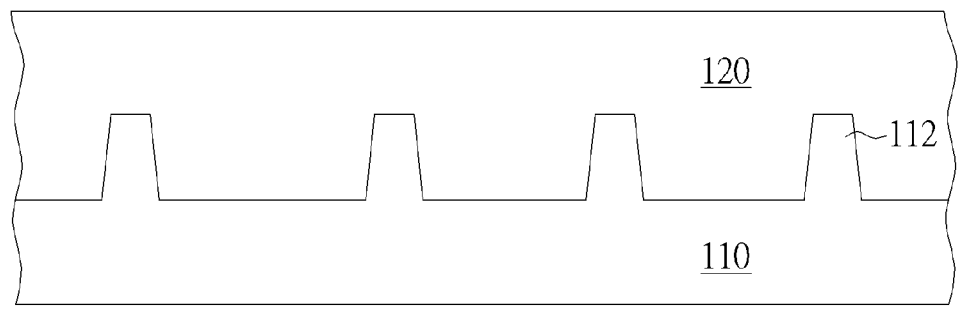
FIGS. 2-8 schematically depict cross-sectional views of a semiconductor process according to an embodiment of the present invention.

FIG. 1 schematically depicts a top view of a semiconductor process according to an embodiment of the present invention. As shown in FIG. 1, a plurality of fin structures 112 are formed in a substrate 110. The method of forming the fin structures 112 may include, but is not limited to, the following. A bulk bottom substrate (not shown) is provided. A hard mask layer (not shown) is formed on the bulk bottom substrate (not shown) and is patterned to define the locations of the fin structures 112, which will be formed in the bulk bottom substrate (not shown). An etching process is performed to form the fin structures 112 in the bulk bottom substrate (not shown), and then isolation structures (not shown) may be formed between bottom parts of the fin structures 112. Thus, the fin structures 112 located in the substrate 110 are formed completely. In one embodiment, the hard mask layer (not shown) is removed after the fin structures 112 are formed, and a tri-gate MOSFET can be formed in the following processes. There are three contact faces between the fin structure 112 and the following formed dielectric layer functioning as a carrier channel whose width is wider than a channel width in a conventional planar MOSFET. When a driving voltage is applied, the tri-gate MOSFET produces a double on-current comparing to the conventional planar MOSFET. In another embodiment, the hard mask layer (not shown) is preserved to form a fin field effect transistor (Fin FET), which is another kind of multi-gate MOSFET. Due to the hard mask layer (not shown) being preserved in the fin field effect transistor, there are only two contact faces between each of the fin structure 112 and the following formed dielectric layer.

The present invention can also be applied to other semiconductor substrates. For example, a silicon-on-insulator substrate (not shown) is provided, and then a single crystalline silicon layer being a top part of the silicon-on-insulator substrate (not shown) is etched till an oxide layer being a middle part of the silicon-on-insulator substrate (not shown) is exposed, meaning the fin structures formed on the silicon-on-insulator substrate (not shown) is finished.

For clarifying the present invention, four fin structures 112 are depicted in this embodiment, but the present invention can also be applied to single or other a plurality of fin structures 112.

Two sacrificial gate strips 120 are formed across the fin structures 112 and the substrate 110. In this embodiment, two sacrificial gate strips 120 are depicted, but the present invention is not restricted thereto. The method of forming the sacrificial gate strips 120 may include, but is not limited to, the following. A sacrificial gate material (not shown) may blanketly cover the fin structures 112 and the substrate 110; a hard mask layer (not shown) may be formed and patterned to define positions of the sacrificial gate strips 120 in the sacrificial gate material; processes such as a photolithography and etching process are performed to transfer layouts of the hard mask layer into the sacrificial gate material, and the sacrificial gate strips 120 are therefore formed; then, the hard mask layer is removed. In this case, the sacrificial gate material is amorphous silicon, but it is not limited thereto. In another case, the sacrificial gate material may be polysilicon, or others. Each of the sacrificial gate strip 120 may include a gate dielectric layer (not shown), a sacrificial gate electrode (not shown) and a cap layer (not shown) stacked from bottom to top. A spacer (not shown) may be formed on the substrate 110 beside each of the sacrificial gate strip 120.

A dielectric layer 130 is formed beside the sacrificial gate strips 120 and blanketly cover the substrate 110. More precisely, a dielectric material (not shown) may blanketly cover the sacrificial gate strips 120, the fin structures 112 and the substrate 110; the dielectric material may be planarized to form the dielectric layer 130 having a flat top surface and to expose the sacrificial gate strips 120. In this embodiment, the dielectric layer 130 is an oxide layer, which may be an inter-level dielectric layer, but it is not limited thereto.

Figure 3:
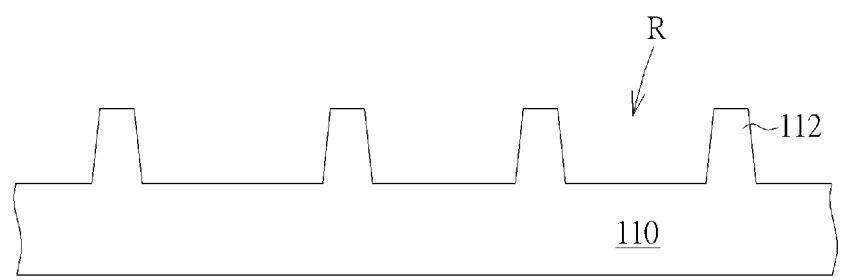

For illustrating the present invention clearly, FIGS. 2-8 depict cross-sectional views of a semiconductor process along AA' line of FIG. 1. Please refer to FIG. 2, which is a cross-sectional view along AA' line of FIG. 1. The fin structures 112 are located in the substrate 110, and the sacrificial gate strip 120 is disposed across the fin structures 112 and the substrate 110. Since FIGS. 2-8 only depict one of the sacrificial gate strips 120 alone AA' line of FIG. 1, only processing steps of one of the sacrificial gate strips 120 are presented, but the other one of the sacrificial gate strips 120 has common processing steps, In this embodiment, a replacement metal gate (RMG) process may be performed to replace the sacrificial gate strip 120 with a metal gate strip. More precisely, the sacrificial gate strip 120 is removed, and therefore a trench R is formed in the dielectric layer 130 of FIG. 1, as shown in FIG. 3. A method of removing the trench R may include an etching process, which has etching selectivity to the sacrificial gate strip 120 and other material layers contacting the sacrificial gate strip 120, but it is not limited thereto. In one case, as the spacer is beside the sacrificial gate strip 120, the spacer can still be preserved after the sacrificial gate strip 120 is removed.

Figure 4:
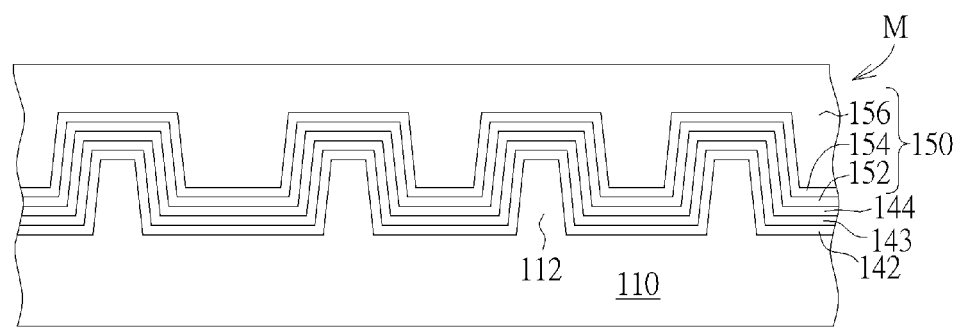

As shown in FIG. 4, a selective buffer layer 142, a dielectric layer having a high dielectric constant 143 and a bottom barrier layer 144 maybe sequentially formed in the trench R and on the fin structures 112 and the substrate 110.

In this embodiment, a gate-last for high-k last process is applied, so that the sacrificial gate strip 120 is formed and removed firstly, and a dielectric layer having a high dielectric constant fills into the trench R, but it is not limited thereto. In another embodiment, a gate-last for high-k first process is applied, so that a dielectric layer having a high dielectric constant is directly formed before the sacrificial gate strip 120 is formed, and the sacrificial gate strip 120 is formed directly on the dielectric layer having a high dielectric constant, and then the dielectric layer having a high dielectric constant is still preserved as the sacrificial gate strip 120 is removed. In other embodiments, a gate first process or other semiconductor process may be applied instead.

The selective buffer layer 142 may be an oxide layer, which may be formed through a chemical oxide process or a thermal oxide process, but it is not limited thereto. The selective buffer layer 142 is located between the dielectric layer having a high dielectric constant 143 and the substrate 110 to buffer the dielectric layer having a high dielectric constant 143 and the substrate 110. The dielectric layer having a high dielectric constant 143 maybe chosen from the group selected from hafnium oxide ($HfO_2$), hafnium silicon oxide ($HfSiO_4$), hafnium silicon oxynitride (HfSiON), aluminum. oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_1-xO_3$, PZT) and barium strontium titanate ($Ba_xSr_1-xTiO_3$, BST), but it is not limited thereto. The bottom barrier layer 144 may be a single layer or multilayer composed of tantalum nitride (TaN), titanium nitride (TiN), or others.

Please refer to FIG. 4 still, a metal gate material 150 may fill into the trench R on the bottom barrier layer 144 and then be planarized, thereby a metal gate strip M being formed. The metal gate material 150 may include a work function metal layer 152, a top barrier layer 154 and a main conductive layer 156 sequentially filling into. The work function metal layer 152 may be a single layer or a multilayer structure, composed of titanium nitride (TiN), titanium carbide (TiC), tantalum nitride (TaN), tantalum carbide (TaC), tungsten carbide (WC), titanium aluminide (TiAl) or aluminum titanium nitride (TiAlN), or others; the top barrier layer 154 maybe a single layer or a multilayer structure composed of tantalum nitride (TaN) or titanium nitride (TiN), or others; the main conductive layer 156 may be composed of low resistivity materials such as aluminum, tungsten, titanium aluminum (TiAl) alloy, cobalt tungsten phosphide (CoWP), or others.

Figure 5:
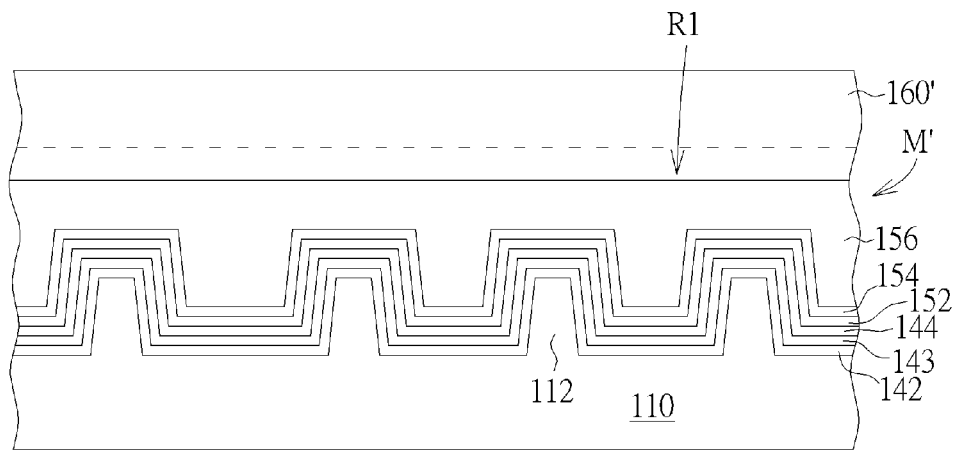
Figure 6:
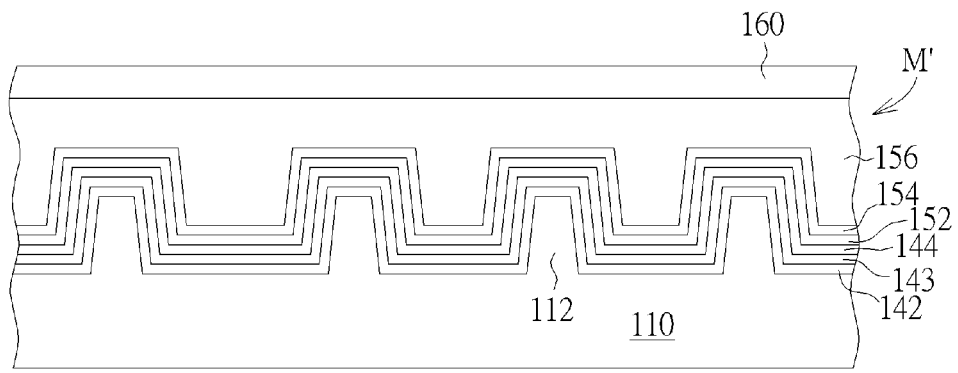

Please refer to FIGS. 5-6, a cap layer 160 may be formed on a metal gate strip M'. More precisely, the metal gate strip M may be etched to form a first trench R1, as shown in FIG. 5. A dashed line represents the etched part of the metal gate strip M and the first trench R1. Then, a cap layer material 160' may fill into the first trench R1. As shown in FIG. 6, the cap layer material 160' is planarized to form the cap layer 160 in the first trench R1. In this embodiment, the cap layer 160 may be a nitride layer, and may be a self-aligned contact (SAC) layer, but it is not limited thereto. The cap layer 160 must have different materials from the below metal gate strip M' and the dielectric layer 130 (shown in FIG. 1) beside the metal gate strip M', for have etching selectivity during later etching processes.

Figure 7:
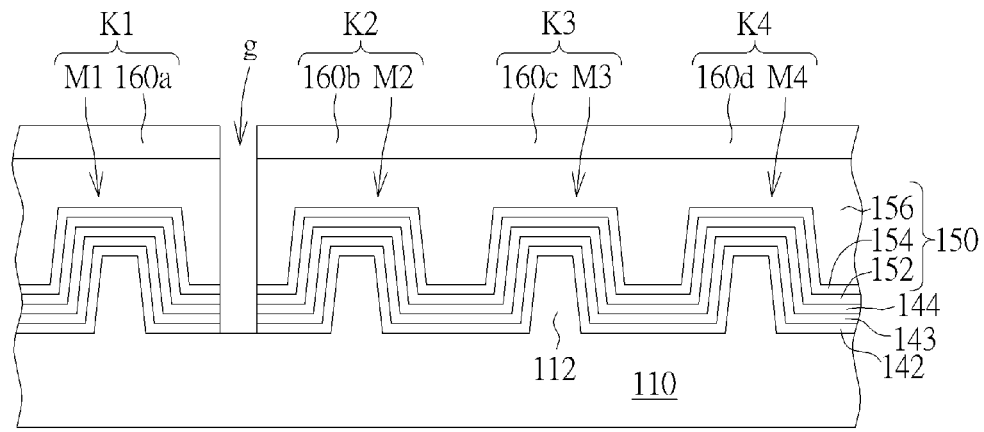
Figure 9:
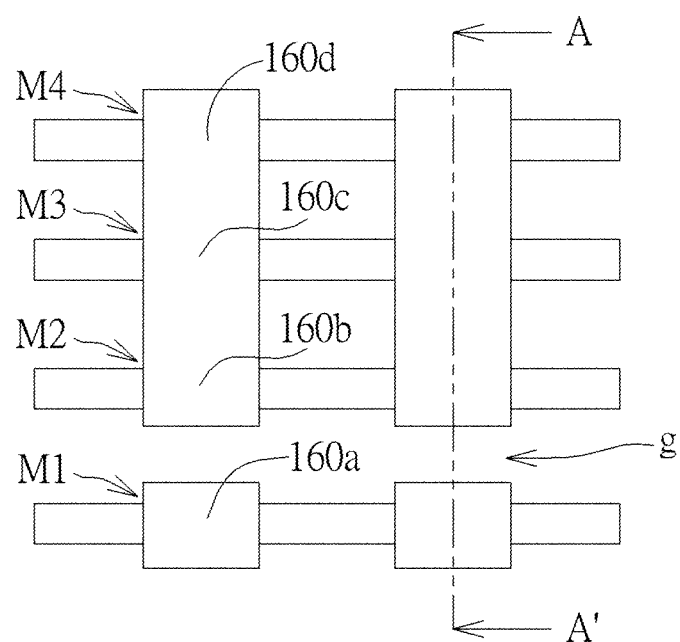
FIG. 9 schematically depicts a top view of a semiconductor process according to an embodiment of the present invention.

The cap layer 160 and the metal gate strip M' are cut off to form a plurality of caps 160a/160b/160c/160d on metal gates M1/M2/M3/M4 respectively, and to have a gap g separating adjacent caps 160a/160b and adjacent metal gates M1/M2, as shown in FIG. 7. Each of the caps 160a/160b/160c/160d and each of the corresponding metal gates M1/M2/M3/M4 constitute each stacked structure K1/K2/K3/K4. Each of the metal gates M1/M2/M3/M4 covers each of the fin structures 112 to form transistors respectively. A method of cutting off the cap layer 160 and the metal gate strip M' may include a photolithography and etching process, which cuts off exposed parts of the cap layer 160 and the metal gate strip M' to form the gap g, but it is not limited thereto. FIG. 9 is a top view of FIG. 7. The gap g isolates the caps 160a/160b and isolates the metal gates M1/M2. In this embodiment, the metal gate material 150, the bottom barrier layer 144, the dielectric layer having a high dielectric constant 143 and the selective buffer layer 142 are cut off completely, but it is not limited thereto. In other embodiments, all of the conductive layers may be cut off with the dielectric layer having a high dielectric constant 143 and the selective buffer layer 142 being preserved. On the other hand, in one case, as the spacer beside each of the sacrificial gate strip 120 said previously is preserved after the sacrificial gate strip 120 is removed, the spacer may be cut off as well as the cap layer 160 and the metal gate strip M' are cut off. In some cases, the lateral (meaning the direction orthogonal to AA' line of FIG. 9) cutting range of the cap layer 160 and the metal gate strip M' exceeds the lateral width of the cap layer 160 and the metal gate strip M'.

Figure 8:
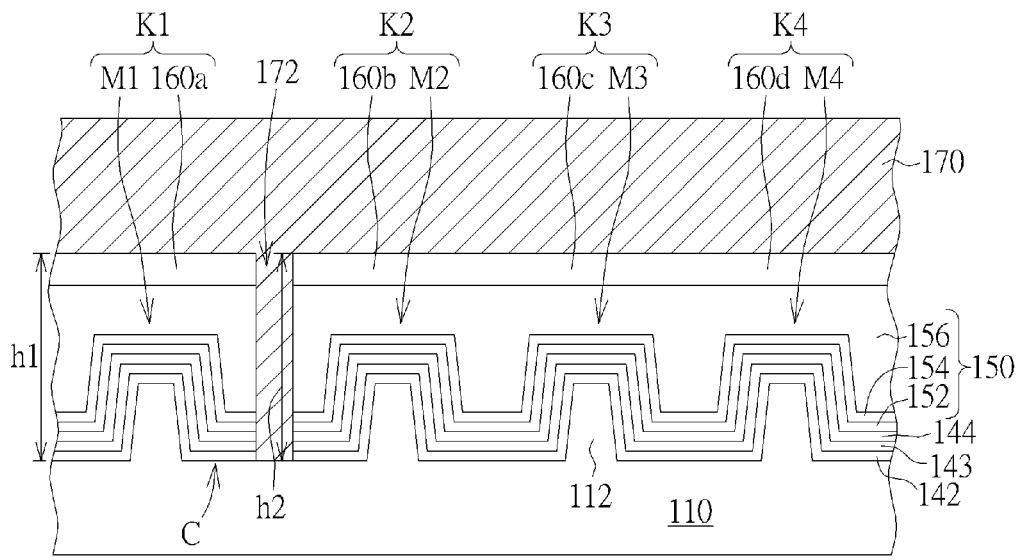

As shown in FIG. 8, an isolation material (not shown) may fill into the gap g after the cap layer 160 and the metal gate strip M' are cut off, to form an isolation slot 172 and a first dielectric layer 170 on the caps 160a/160b/160c/160d. Thereby, the isolation slot 172 isolates and directly contacts the stacked structures K1/K2 at end to end. It is emphasized that, the isolation slot 172 is formed after the metal gate strip M' and the cap layer 160 are formed, therefore preventing the metal gates from being etched directly, which results in over-loss of the metal gates and enlarges critical dimension (CD). In this embodiment, the isolation slot 172 and the first dielectric layer 170 are formed by one single process, which may be a single deposition process, but it is not limited thereto. In a preferred embodiment, the deposition process may be a plasma enhanced chemical vapor deposition (PECVD) process. In a still preferred embodiment, the plasma enhanced chemical vapor deposition (PECVD) process may be a plasma enhanced chemical vapor deposition (PECVD) process utilizing tetraethylorthosilicate (TEOS) as a silicon source. By doing this, due to the isolation slot 172 and the first dielectric layer 170 being formed by one single process, processes can be simplified, and the isolation slot 172 is an extension part of the first dielectric layer 170 with the isolation slot 172 and the first dielectric layer 170 being one piece, but it is not limited thereto. In other embodiments, the isolation slot 172 and the first dielectric layer 170 may be formed by different processes, depending upon practical requirements.

Thereafter, later processes such as metal interconnection forming processes may be performed.

Above all, since the cap layer 160 and the metal gate strip M' are cut off to form the isolation slot 172 after the cap layer 160 and the metal gate strip M' are formed, the formed structure as shown in FIG. 8 includes the selective buffer layer 142, the dielectric layer having a high dielectric constant 143, the bottom barrier layer 144, the work function metal layer 152, the top barrier layer 154 and the main conductive layer 156 having a continuous cross-sectional profile C cut off by the isolation slot 172, wherein the continuous cross-sectional profile C directly contacts the isolation slot 172. Moreover, the work function metal layer 152 and the top barrier layer 154 have U-shaped cross-sectional profiles, while the dielectric layer having a high dielectric constant 143 and the bottom barrier layer 144 may have U-shaped cross-sectional profiles or "--"-shaped cross-sectional profiles depending upon a gate-last for high-k last process or a gate-last for high-k first process being applied. Heights h1 of the stacked structures K1/K2/K3/K4 constituted by the caps 160a/160b/160c/160d and the corresponding metal gates M1/M2/M3/M4 are same level with a height h2 of the isolation slot 172.

The process of the present invention, which cuts off the cap layer 160 and the metal gate strip M' to form the isolation slot 172 after the cap layer 160 and the metal gate strip M' are formed can have many advantages rather than a conventional process, which etches the sacrificial gate strip 120 directly and forms an isolation slot therein, and then forms the metal gates, such that: (1) avoiding residues of the sacrificial gate strip 120 from being left in a gap for forming an isolation slot as the sacrificial gate strip 120 is patterned; (2) reducing loss of the dielectric layer 130, enhance maintaining heights of the metal gates M1/M2/M3/M4; (3) avoiding voids generating beside the isolation slot caused by gap filling difficulty as forming an isolation slot before filling metal gates; (4) loading effect of polishing processes performed before the isolation slot is formed such as a polishing process to the inter-level dielectric layer, a polishing process to form the metal gates can be reduced due to material layers such as the density of sacrificial gate strip being distributed uniformly, enhancing uniformity and flatness as performed by these polishing processes; (5) a height of a trench etching in the metal gate strip M' for forming an isolation slot is shallower than a height of a trench etching in the sacrificial gate strip 120 for forming an isolation slot, thereby the etching can be easier and problems occurring during the etching can be reduced; and (6) size of a formed semiconductor component can be shrunk due to said advantages.

To summarize, the present invention provides a semiconductor structure and process thereof, which sequentially forms a metal gate strip and a cap layer, and then cuts off the cap layer and the metal gate strip to form an isolation slot therein. Thereby, the present invention can have advantages rather than a conventional method of forming an isolation slot in a sacrificial gate strip before forming metal gates. For example, advantages include avoiding residues of sacrificial gate materials being left in a trench for forming the isolation slot, reducing shorter heights of metal gates occurring caused by loss of a dielectric layer, avoiding voids beside the isolation slot generating due to gap filling difficulty of metal gate materials, reducing loading effect of polishing processes by having densities of material layers distributed uniformly, reducing an etching height of a trench for forming the isolation slot. Therefore, the present invention can improve many problems occurring during processes, and thus enhance size miniaturization of a formed semiconductor component and improve the reliability and yields of the formed semiconductor component.

Furthermore, the isolation slot is formed after a cap layer is formed in the present invention, so that over-loss of metal gates can be avoided caused by directly etching the metal gates, and thus enlarging of critical dimension (CD) can be avoided. Besides, the isolation slot and the first dielectric layer can be formed by one single process and thus simplifies processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
   forming a metal gate strip in a trench of a dielectric layer;
   forming a cap layer on the metal gate strip;
   cutting off the cap layer and the metal gate strip to form a plurality of caps on a plurality of metal gates, and to have a gap separating adjacent caps and adjacent metal gates;
   filling an isolation material in the gap after the cap layer and the metal gate strip are cut off; and
   forming a first dielectric layer on the caps after filling the isolation material, wherein the first dielectric layer and the isolation material are formed by one single deposition process.

2. The semiconductor process according to claim 1, further comprising:
   forming the dielectric layer on a substrate before the metal gate strip is formed, wherein the substrate has a plurality of fin structures, enabling each of the metal gates to cover each of the fin structures respectively.

3. The semiconductor process according to claim 1, wherein the method of forming the metal gate strip comprises a replacement metal gate (RMG) process.

4. The semiconductor process according to claim 3, wherein the step of forming the metal gate strip comprises:
   forming a sacrificial gate strip;
   forming the dielectric layer beside the sacrificial gate strip;
   removing the sacrificial gate strip to form the trench; and
   filling a metal gate material in the trench.

5. The semiconductor process according to claim 1, wherein the metal gate strip comprises a work function metal layer and a main conductive layer.

6. The semiconductor process according to claim 1, further comprising:
   forming a dielectric layer having a high dielectric constant in the trench before the metal gate strip is formed.

7. The semiconductor process according to claim 1, wherein the cap layer comprises a self-aligned contact (SAC) cap layer.

8. The semiconductor process according to claim 1, wherein the deposition process comprises a plasma enhanced chemical vapor deposition (PECVD) process.

9. The semiconductor process according to claim 8, wherein the plasma enhanced chemical vapor deposition (PECVD) process comprises a plasma enhanced chemical vapor deposition (PECVD) process utilizing tetraethylorthosilicate (TEOS) as a silicon source.

10. The semiconductor process according to claim 1, wherein the cap layer and the metal gate strip are cut off by an etching process.

11. The semiconductor process according to claim 1, further comprising:
    etching the metal gate strip to form a first trench before the cap layer is formed, enabling the cap layer to be formed in the first trench;
    wherein the step of forming the cap layer comprises:
       filling a cap layer material in the first trench; and
       planarizing the cap layer material to form the cap layer.

12. A semiconductor process, comprising:
    forming a metal gate strip replaced from a sacrificial gate strip in a trench of a dielectric layer;
    forming a cap layer on the metal gate strip, wherein the metal gate strip is etched to form a first trench before the cap layer is formed, enabling the cap layer to be formed in the first trench;
    cutting off the cap layer and the metal gate strip to form a plurality of caps on a plurality of metal gates, and to have a gap separating adjacent caps and adjacent metal gates; and
    filling an isolation material in the gap after the cap layer and the metal gate strip are cut off.

13. The semiconductor process according to claim 12, further comprising:
    forming the dielectric layer on a substrate before the metal gate strip is formed, wherein the substrate has a plurality of fin structures, enabling each of the metal gates to cover each of the fin structures respectively.

14. The semiconductor process according to claim 12, wherein the method of forming the metal gate strip comprises a replacement metal gate (RMG) process.

15. The semiconductor process according to claim 14, wherein the step of forming the metal gate strip comprises:
    forming the sacrificial gate strip;
    forming the dielectric layer beside the sacrificial gate strip;
    removing the sacrificial gate strip to form the trench; and
    filling a metal gate material in the trench.

16. The semiconductor process according to claim 12, wherein the metal gate strip comprises a work function metal layer and a main conductive layer.

17. The semiconductor process according to claim 12, further comprising:
    forming a second dielectric layer having a high dielectric constant in the trench before the metal gate strip is formed.

18. The semiconductor process according to claim 12, wherein the cap layer comprises a self-aligned contact (SAC) cap layer.

19. The semiconductor process according to claim 12, further comprising:
    forming a first dielectric layer on the caps after filling the isolation material.

20. The semiconductor process according to claim 19, wherein the first dielectric layer and the isolation material are formed by one single deposition process.

21. The semiconductor process according to claim 20, wherein the deposition process comprises a plasma enhanced chemical vapor deposition (PECVD) process.

22. The semiconductor process according to claim 21, wherein the plasma enhanced chemical vapor deposition (PECVD) process comprises a plasma enhanced chemical vapor deposition (PECVD) process utilizing tetraethylorthosilicate (TEOS) as a silicon source.

23. The semiconductor process according to claim 12, wherein the cap layer and the metal gate strip are cut off by an etching process.

24. The semiconductor process according to claim 12, wherein the step of forming the cap layer comprises:
    filling a cap layer material in the first trench; and
    planarizing the cap layer material to form the cap layer.

* * * * *